US008441039B2

(12) United States Patent  
Chakravarti et al.

(10) Patent No.: US 8,441,039 B2  
(45) Date of Patent: *May 14, 2013

(54) NANOPILLAR E-FUSE STRUCTURE AND PROCESS

(71) Applicant: International Business Machines Corporation, Armonk, NY (US)

(72) Inventors: Satya N. Chakravarti, Hopewell Junction, NY (US); Dechao Guo, Fishkill, NY (US); Huiming Bu, Millwood, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/652,804

(22) Filed: Oct. 16, 2012

(65) Prior Publication Data

US 2013/0048988 A1    Feb. 28, 2013

Related U.S. Application Data

(62) Division of application No. 12/627,747, filed on Nov. 30, 2009, now Pat. No. 8,344,428.

(51) Int. Cl.  
*H01L 23/52* (2006.01)

(52) U.S. Cl.  
USPC ........... 257/209; 257/208; 257/529; 257/530; 257/E31.149; 438/131; 438/132; 438/215; 438/281; 438/333

(58) Field of Classification Search ............... 257/208, 257/209, 529, 530, E23.149; 438/131, 132, 438/215, 281, 333, 467, 601  
See application file for complete search history.

(56) References Cited

U.S. PATENT DOCUMENTS

| | | |
|---|---|---|
| 6,100,746 A | 8/2000 | Wu |
| 6,285,238 B1 | 9/2001 | Wu |
| 6,392,468 B1 | 5/2002 | Wu |
| 6,440,868 B1 | 8/2002 | Besser et al. |
| 6,584,029 B2 | 6/2003 | Tran et al. |
| 6,611,039 B2 | 8/2003 | Anthony |
| 6,624,499 B2 | 9/2003 | Kothandaraman et al. |
| 6,876,594 B2 | 4/2005 | Griesmer et al. |
| 7,215,177 B2 | 5/2007 | Sueoka |
| 7,315,193 B2 | 1/2008 | Anand et al. |
| 7,385,234 B2 | 6/2008 | Gopalakrishnan et al. |
| 2006/0060832 A1 | 3/2006 | Symanczyk et al. |
| 2007/0004203 A1 | 1/2007 | Streck et al. |
| 2007/0090486 A1 | 4/2007 | Otsuka et al. |
| 2008/0067555 A1 | 3/2008 | Beebe et al. |
| 2008/0128771 A1 | 6/2008 | Yang et al. |
| 2008/0237786 A1 | 10/2008 | Yang et al. |
| 2009/0001045 A1 | 1/2009 | Chen et al. |

OTHER PUBLICATIONS

Y. Shacham-Diamand, "Filament Formation and the Final Resistance Modeling in Amorphous-Silicon Vertical Programmable Element," IEEE Transactions on Electron Devices, vol. 40, No. 10, pp. 1780-1788 (Oct. 1993).

*Primary Examiner* — Steven Loke  
*Assistant Examiner* — Cuong Nguyen  
(74) *Attorney, Agent, or Firm* — Vazken Alexanian; Michael J. Chang, LLC

(57) ABSTRACT

Techniques for incorporating nanotechnology into electronic fuse (e-fuse) designs are provided. In one aspect, an e-fuse structure is provided. The e-fuse structure includes a first electrode; a dielectric layer on the first electrode having a plurality of nanochannels therein; an array of metal silicide nanopillars that fill the nanochannels in the dielectric layer, each nanopillar in the array serving as an e-fuse element; and a second electrode in contact with the array of metal silicide nanopillars opposite the first electrode. Methods for fabricating the e-fuse structure are also provided as are semiconductor devices incorporating the e-fuse structure.

11 Claims, 4 Drawing Sheets

NANOPILLAR E-FUSE STRUCTURE AND PROCESS

CROSS-REFERENCE TO RELATED APPLICATION(S)

This application is a divisional of U.S. application Ser. No. 12/627,747 filed on Nov. 30, 2009 the disclosure of which is incorporated by reference herein.

FIELD OF THE INVENTION

The present invention relates to electronic fuses (e-fuses), and more particularly, to techniques for incorporating nanotechnology into e-fuse designs.

BACKGROUND OF THE INVENTION

Electronic fuses (e-fuses) can be employed as programmable elements in integrated circuit designs. In general, the programming of an e-fuse involves applying a substantially high voltage or current to open a fuse element (in alternating current (AC) or direct current (DC) mode) within an integrated circuit. The programming of an e-fuse does not involve a physical rupture of the fuse element. E-fuse technology has become increasingly popular in semiconductor designs for yield improvement, circuit configuration, security activation and many other applications.

Current design trends are moving towards employing smaller feature sizes in circuit layouts. With such scaling, however, it becomes increasingly challenging to integrate e-fuse capabilities into the designs without losing efficiency or overall functionality of the e-fuse.

Therefore, scalable e-fuse designs and techniques for the fabrication thereof would be desirable.

SUMMARY OF THE INVENTION

The present invention provides techniques for incorporating nanotechnology into electronic fuse (e-fuse) designs. In one aspect of the invention, an e-fuse structure is provided. The e-fuse structure includes a first electrode; a dielectric layer on the first electrode having a plurality of nanochannels therein; an array of metal silicide nanopillars that fill the nanochannels in the dielectric layer, each nanopillar in the array serving as an e-fuse element; and a second electrode in contact with the array of metal silicide nanopillars opposite the first electrode.

In another aspect of the invention, a method for fabricating an e-fuse structure is provided. The method includes the following steps. A first electrode is formed. A dielectric layer is formed on the first electrode having a plurality of nanochannels therein. An array of metal silicide nanopillars are formed that fill the nanochannels in the dielectric layer, each nanopillar in the array serving as an e-fuse element. A second electrode is formed in contact with the array of metal silicide nanopillars opposite the first electrode.

In yet another aspect of the invention, a semiconductor device is provided. The semiconductor device includes a substrate; a circuit layer adjacent to the substrate; and an e-fuse structure on a side of the circuit layer opposite the substrate. The e-fuse structure includes a first electrode; a dielectric layer on the first electrode having a plurality of nanochannels therein; an array of metal silicide nanopillars that fill the nanochannels in the dielectric layer, each nanopillar in the array serving as an e-fuse element; and a second electrode in contact with the array of metal silicide nanopillars opposite the first electrode.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-6 are cross-sectional diagrams illustrating an exemplary methodology for fabricating a semiconductor device having a nanopillar electronic fuse (e-fuse) structure. In general, an e-fuse includes an anode and a cathode connected by a fuse element. With the present techniques, as will be described in detail below, the e-fuse element is formed from a silicide nanopillar array. The use of nanopillar array-based e-fuse elements advantageously allows for aggressive device scaling far beyond the capabilities of conventional planar e-fuse configurations, without sacrificing performance of the e-fuses.

Figure 1:
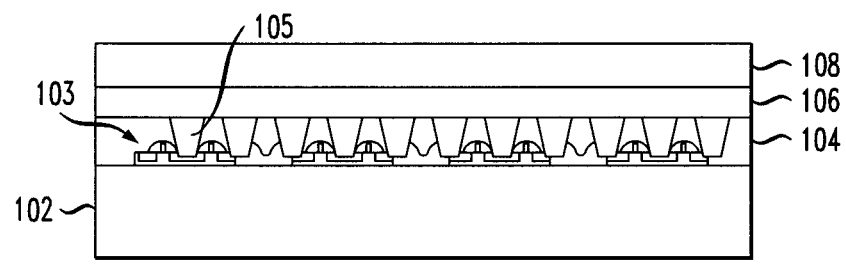
FIGS. 1-6 are cross-sectional diagrams illustrating an exemplary methodology for fabricating a semiconductor device having a nanopillar electronic fuse (e-fuse) structure according to an embodiment of the present invention.

The process begins, as shown in FIG. 1, with a substrate 102 being provided. A variety of known substrate configurations can be used. For example, substrate 102 can be a bulk silicon (Si) substrate or a silicon-on-insulator (SOI) wafer. A circuit layer 104 is then formed on substrate 102. As shown in FIG. 1, circuit layer 104 contains a plurality of integrated circuit elements, such as logic and/or memory transistors 103, which can be formed on substrate 102 using standard front-end-of-line (FEOL) processing. In general, each transistor can have a source region and a drain region interconnected by a channel region, and a gate region over the channel region. Transistors and processes for forming transistors are well known to those of skill in the art, and thus are not described further herein. A plurality of vias 105 are formed through circuit layer 104, and will serve to connect one or more of transistors 103 to the nanopillar e-fuses (see below). Processes for forming vias are well known to those of ordinary skill in the art, and thus are not described further herein.

To begin fabrication of the e-fuse structure, a first electrode 106 is formed on a side of circuit layer 104 opposite substrate 102. First electrode 106 will serve as either an anode or cathode of the e-fuse structure. According to an exemplary embodiment, first electrode 106 consists of a metal, such as titanium nitride (TiN) and/or tungsten (W), and is deposited using methods such as plasma vapor deposition (PVD) or atomic layer deposition (ALD), to a thickness of from about five nanometers (nm) to about 20 nm. While FIG. 1 depicts the first electrode being formed over the circuit layer, this configuration is merely exemplary and shown for illustrative purposes. Fabrication of the present nanopillar e-fuse structure can begin with the formation of the first electrode on any relevant layer/surface.

A dielectric layer 108 is then formed on a side of first electrode 106 opposite circuit layer 104. According to an exemplary embodiment, dielectric layer 108 contains silicon nitride (SiN), silicon dioxide ($SiO_2$) or a low-k dielectric material (i.e., a material having a dielectric constant k of less than about 3.9, e.g., a dielectric constant k of from about 2.3 to about 3.5) and is formed having a thickness of from about 20 nm to about 100 nm. Dielectric layer 108 can be formed using standard deposition techniques, such as chemical vapor deposition (CVD), plasma-enhanced CVD (PECVD) and ALD for SiN and $SiO_2$ deposition. As will be described, for example, in conjunction with the description of FIG. 3, below, a plurality of nanochannels will be formed in dielectric layer 108. The nanochannels will serve as regions for forming silicide nanopillar e-fuse elements. Each nanochannel formed in dielectric layer 108 will have a height h comparable to the thickness of dielectric layer 108, i.e., a height h of from about 20 nm to about 100 nm.

Figure 2:
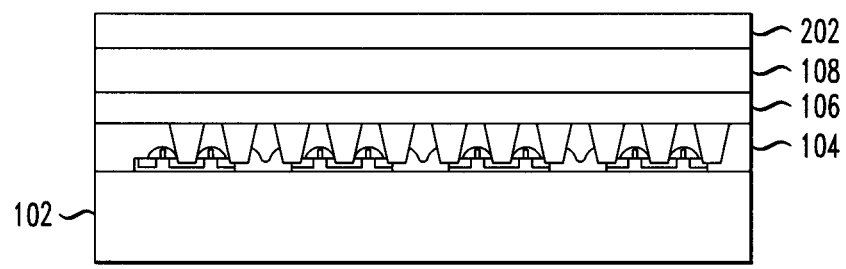

As shown in FIG. 2, a copolymer layer 202 is formed on a side of dielectric layer 108 opposite first electrode 106. According to an exemplary embodiment, copolymer layer 202 comprises a diblock copolymer, such as a random copolymer of polystyrene (PS) and poly (methyl methacrylate) (PMMA) (abbreviated as PS-ran-PMMA) or a PS-block-PMMA copolymer (abbreviated as PS-b-PMMA), and is spin-coated onto dielectric layer 108 (i.e., so as to form a self-aligned layer/film) to a thickness of from about 20 nm to about 80 nm. The diblock copolymer can be spin-coated onto dielectric layer 108 at about 1,000 revolutions per minute (RPM) to attain adequate coverage.

Figure 3:
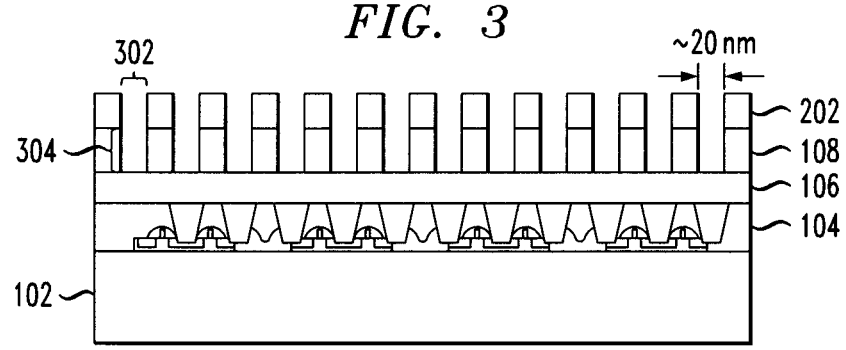

As shown in FIG. 3, copolymer layer 202 is then processed to create a mask that is used in the formation of nanochannels in dielectric layer 108. According to an exemplary embodiment, annealing is used to form nanopores 302 in copolymer layer 202, through which conventional reactive ion etching (RIE) is used to etch nanochannels 304 in dielectric layer 108. By way of example only, the nanopores formed can have an average diameter of about 20 nm and can be spaced on average about 40 nm from one another. According to an exemplary embodiment, the assembly is annealed at a temperature of from about 150 degrees Celsius (° C.) to about 180° C. for a duration of about 48 hours to promote the nanopore formation. The surface of copolymer layer 202 can then be rinsed, e.g., in toluene, to remove unattached chains. Since the nanochannels are formed through the 'nanopore mask,' the nanochannels formed in dielectric layer 108 will similarly each have a diameter of about 20 nm.

Figure 4:
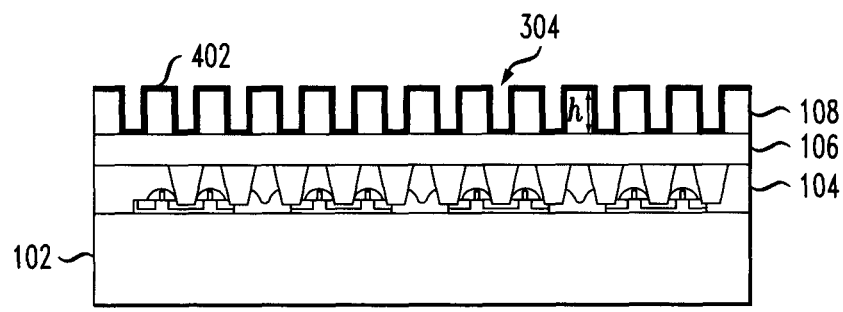

As shown in FIG. 4, copolymer layer 202 is removed. According to an exemplary embodiment, copolymer layer 202 is removed using a two step removal process. In the first step, the assembly is exposed to a downstream hydrogen ($H_2$) or forming gas plasma for a length of time of from about 30 seconds to about two minutes at a temperature of from about 75° C. to about 100° C. so as to weaken the copolymer to make the copolymer more hydrophilic. In the second step, a wet etch is performed with standard SC1 ($H_2O:H_2O_2$: $NH_4OH$ in volume ratio of from about 5:1:1 to about 7:2:1) for a duration of from about two minutes to about five minutes at either room temperature or at a temperature of from about 50° C. to about 75° C. Alternatively, in the second step, supercritical carbon dioxide ($CO_2$) can be used (with or without a co-solvent, such as five percent (%) toluene) to dissolve or cause a swelling of the weakened copolymer and to detach/remove the copolymer.

Each resulting nanochannel 304 in dielectric layer 108 can have a height h of from about 20 nm to about 100 nm (based, for example, on the thickness of dielectric layer 108, as highlighted above). Amorphous silicon 402 is then deposited over, and lining nanochannels 304 in dielectric layer 108. Amorphous silicon 402 can be deposited over dielectric layer 108 using CVD (or alternatively low pressure CVD (LPCVD)) to a uniform thickness of from about 20 nm to about 100 nm. Amorphous silicon 402, along with a deposited metal (e.g., nickel) will be used to form a metal silicide (e.g., nickel silicide (NiSi)), see, for example, the description of FIG. 5, below. The metal silicide, or simply silicide, will form an array of programmable e-fuse elements, see below.

Figure 5:
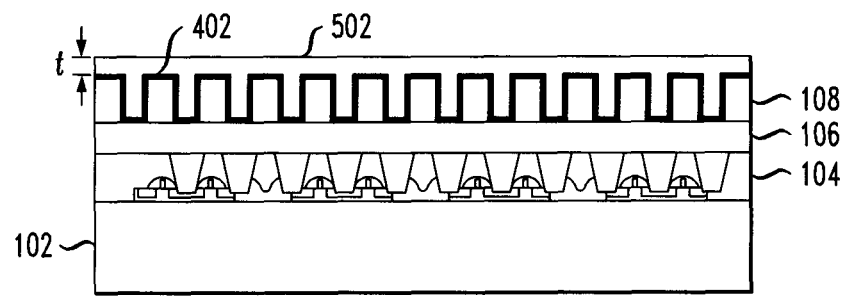

As shown in FIG. 5, a metal 502 is deposited over amorphous silicon 402 filling nanochannels 304. According to an exemplary embodiment, metal 502 is nickel (Ni) obtained from a nickel tetracarbonyl ($Ni(CO)_4$) precursor and is deposited over amorphous silicon 402 using CVD to a thickness t of about two nm.

A low temperature anneal is then used to form a metal silicide by interdiffusing the atoms from amorphous silicon 402 and metal 502. The silicide will consume a portion of amorphous silicon 402. The silicide formed will thus be present over the dielectric layer/the remaining portions of the amorphous silicon and will fill the nanochannels. See, for example, FIG. 6.

According to the exemplary embodiment presented above wherein metal 502 is Ni, an anneal at a temperature of from about 350° C. to about 500° C. can be employed to form silicide (e.g., NiSi) 602. The portions of silicide 602 that fill nanochannels 304 form nanopillars 606, collectively referred to herein as a nanopillar array. Each nanopillar 606 has a height and diameter corresponding to the height and diameter of each nanochannel, e.g., a height of from about 20 nm to about 100 nm and a diameter of about 20 nm. Each nanopillar 606 will serve as an e-fuse element, and the e-fuse structure can be "programmed" by applying a current (also referred to herein as a "programming current") to open the elements.

Figure 6:
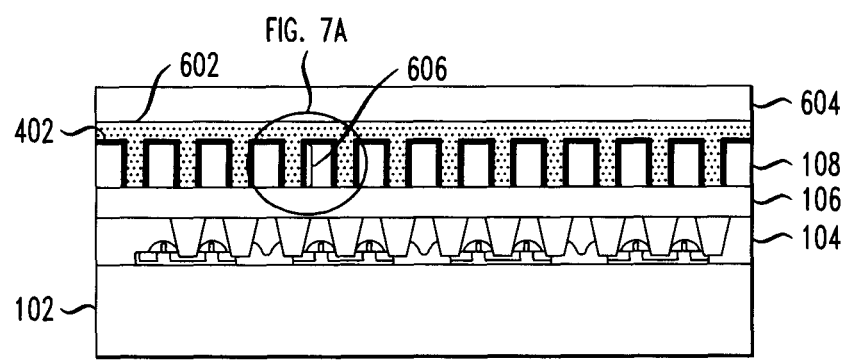

As shown in FIG. 6, a second electrode 604 is formed on a side of silicide 602 opposite first electrode 106 to complete the e-fuse structure. Second electrode 604 will serve as either an anode or cathode of the e-fuse structure. Specifically, first electrode 106 can serve as anode and second electrode 604 can serve as a cathode, or vice versa. As with first electrode 106, second electrode 604 can consist of a metal, such as TiN and/or W, and can be deposited using methods such as PVD or ALD to a thickness of from about five nm to about 20 nm.

Figure 7A:
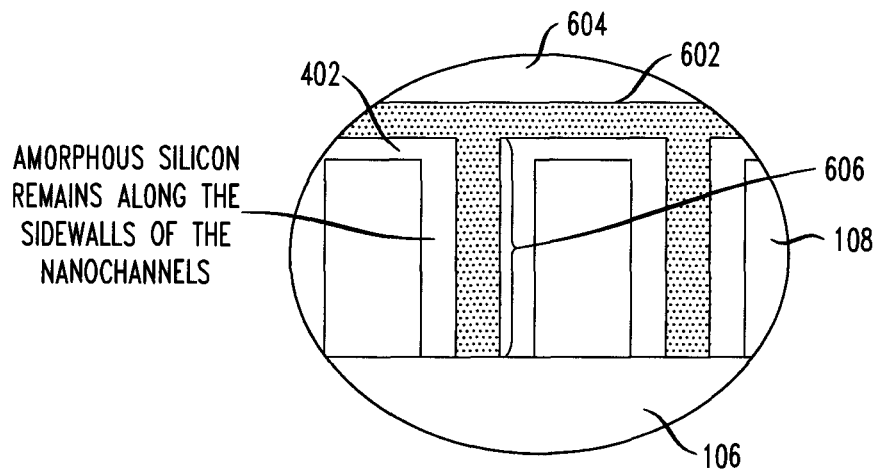
FIG. 7A is a cross-sectional diagram illustrating an enlarged view of several nanopillar e-fuse elements according to an embodiment of the present invention.

While FIG. 6 shows silicide 602 in direct physical contact with both first electrode 106 and second electrode 604 this configuration is not required. Compare, for example, FIGS. 7A and 7B, described below. FIG. 7A is a cross-sectional diagram illustrating an enlarged view of several of the nanopillar e-fuse elements 606. In FIG. 7A, each nanopillar e-fuse element 606 is in direct physical contact with both first electrode 106 and second electrode 604. For example, in FIG. 7A it is shown that the silicide 602 in each nanopillar 606 is in direct contact with first electrode 106, i.e., there are no remaining portions of the amorphous silicon at this interface. During silicidation, the bottom of the nanochannels can get completely silicided while amorphous silicon on the sidewalls remains unsilicided. This is the configuration shown in FIG. 7A.

Figure 7B:
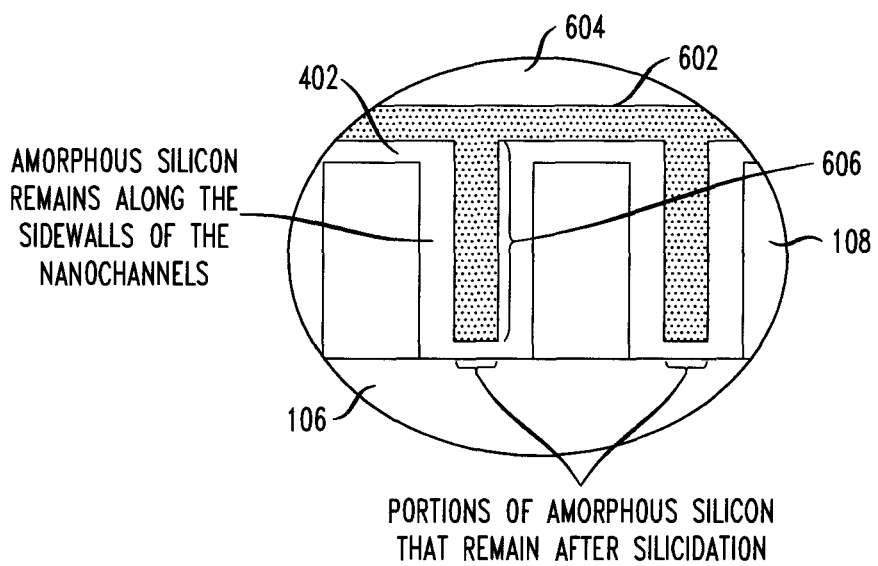
FIG. 7B is a cross-sectional diagram illustrating an alternative view of FIG. 7A according to an embodiment of the present invention.

However, even if silicide is not obtained completely through the amorphous silicon at the bottom of the nanochannels, the e-fuse structure will still function well. This configuration is shown in FIG. 7B. Specifically, FIG. 7B is an alternative view of FIG. 7A wherein silicide 602 is in contact with second electrode 604, however amorphous silicon remains between silicide 602 and first electrode 106 at the bottom of each nanochannel, i.e., amorphous silicon lines the entire nanochannel (both along the sidewalls and bottom of the nanochannel). Either configuration shown in FIG. 7A or 7B is acceptable. The portions of the amorphous silicon that can remain at the bottom of the nanochannels (FIG. 7B) can be regarded as a resistor connected in series, which will not prohibit the e-fuse function. Further, the configurations shown in FIGS. 7A and 7B are not mutually exclusive of one another. For example, it is possible in a given e-fuse structure to have some silicide e-fuse elements that are in contact with the first electrode (with no amorphous silicon lining the bottom of the nanochannels) as in FIG. 7A and others with amorphous silicon (lining the bottom of the nanochannels) in between the silicide and the first electrode as in FIG. 7B.

Whether the silicide is in contact with first electrode 106, or not, it is desirable to have at least some portion(s) of the amorphous silicon remaining after the silicidation (see, for example, FIGS. 7A and 7B wherein amorphous silicon remains along the sidewalls of the nanochannels). With this configuration, the silicide and the amorphous silicon are connected in parallel such that the amorphous silicon can serve as a heating layer to help electron migration in the silicide. Therefore, in the completed e-fuse structure, it is desirable to have amorphous silicon lining the sidewalls (and possible the bottom) of the nanochannels.

Figure 8:
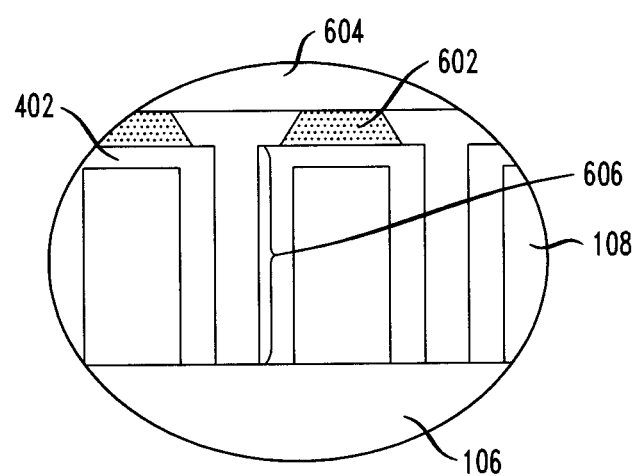
FIG. 8 is a cross-sectional diagram illustrating the same enlarged view of FIG. 7A after programming according to an embodiment of the present invention.

To program the e-fuse structure, a current is applied across the first and second electrodes, i.e., across first electrode 106 and second electrode 604 (which serve as a cathode and an anode (or vice versa), respectively), which causes electromigration of the silicide in the elements. See, for example, FIG. 8 which is a cross-sectional diagram illustrating an enlarged view of several of the nanopillar e-fuse elements 606 after programming. For comparison, the view shown in FIG. 8 is the same as that shown in FIG. 7A to illustrate programmed (FIG. 8) and unprogrammed (FIG. 7A) e-fuse elements, respectively. In FIG. 8, the application of a programming current has 'opened' both of the e-fuse elements shown. Programming of the configuration of FIG. 7B (not shown) would be the same as that shown in FIG. 8, except that amorphous silicon would be present at the bottom of the nanochannels.

Upon programming, the total programming current is distributed throughout the whole array of e-fuse elements. Statistically, there are some e-fuse elements that will be programmed first. Once programmed, these elements become highly resistive. As a result, the programming current has to be distributed by a fewer number of e-fuse elements. The current density will increase and advantageously accelerate the programming of the remaining elements.

What is shown in FIG. 8 is only a schematic representation of the programmed e-fuse elements, as a physical 'rupture' of the silicide does not occur. Once programmed, migration of the silicide causes resistance through the e-fuse elements to increase. Advantageously, with the present e-fuse structure, the dimensions of each e-fuse element are much smaller than conventional planar devices. As a result, the current density will go up once one or more of the nanopillar e-fuse elements are programmed and the current density for the remaining (unprogrammed) e-fuse elements will be automatically higher, and so the programming will be as desired. According to an exemplary embodiment, about six milliamps (mA) at peak pulse current is employed for programming.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor device, comprising:
    a substrate;
    a circuit layer adjacent to the substrate;
    an electronic fuse (e-fuse) structure on a side of the circuit layer opposite the substrate, comprising:
        a first electrode;
        a dielectric layer on the first electrode having a plurality of nanochannels therein;
        a metal silicide layer that forms an array of metal silicide nanopillars that completely fill each of the nanochannels in the dielectric layer such that the metal silicide layer is present in each of the nanochannels, above each of the nanochannels and over the dielectric layer, each nanopillar in the array serving as an e-fuse element; and
        a second electrode in direct physical contact with the array of metal silicide nanopillars opposite the first electrode, wherein one of the first electrode and the second electrode serves as an anode of the e-fuse structure and another of the first electrode and the second electrode serves as a cathode of the e-fuse structure.

2. The semiconductor device of claim 1, wherein the circuit layer comprises one or more transistors.

3. The semiconductor device of claim 2, wherein the circuit layer comprises one or more vias connecting one or more of the transistors to the e-fuse structure.

4. The semiconductor device of claim 1, further comprising amorphous silicon lining at least a portion of each of the nanochannels.

5. The semiconductor device of claim 1, further comprising amorphous silicon lining sidewalls of each of the nanochannels.

6. The semiconductor device of claim 1, wherein the first electrode comprises at least one of titanium nitride and tungsten.

7. The semiconductor device of claim 1, wherein the dielectric layer comprises silicon nitride, silicon dioxide or a low-k dielectric material.

8. The semiconductor device of claim 1, wherein each nanopillar has a height of from about 20 nanometers to about 100 nanometers.

9. The semiconductor device of claim 1, wherein each nanopillar has a diameter of about 20 nanometers.

10. The semiconductor device of claim 1, wherein the second electrode comprises at least one of titanium nitride and tungsten.

11. The semiconductor device of claim 1, wherein the metal silicide comprises nickel silicide.

* * * * *